United States Patent

Hagel et al.

(10) Patent No.: US 7,405,569 B2
(45) Date of Patent: Jul. 29, 2008

(54) MONITORING SYSTEM FOR HIGH-VOLTAGE SWITCHES

(75) Inventors: Marek Hagel, Killwangen (CH); Patrick Fehlmann, Brugg (CH)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 11/606,234

(22) Filed: Nov. 30, 2006

(65) Prior Publication Data
US 2007/0120567 A1 May 31, 2007

(30) Foreign Application Priority Data
Nov. 30, 2005 (EP) .................. 05405679

(51) Int. Cl.
G01R 31/327 (2006.01)
(52) U.S. Cl. .................. 324/421; 324/415; 324/424
(58) Field of Classification Search .................. 324/421, 324/415, 418, 419, 420, 422, 423, 424, 537, 324/538, 700, 71.2, 71.1, 76.11; 73/86
See application file for complete search history.

(56) References Cited

U.S. PATENT DOCUMENTS

| | | | |
|---|---|---|---|
| 4,492,919 A | 1/1985 | Milkovic et al. | |
| 4,922,363 A * | 5/1990 | Long et al. | 361/3 |
| 5,107,204 A | 4/1992 | Bullock et al. | |
| 5,187,341 A * | 2/1993 | Graell | 219/69.13 |
| 6,528,960 B1 | 3/2003 | Roden et al. | |
| 6,765,316 B1 * | 7/2004 | Elsner et al. | 307/130 |
| 6,963,203 B2 * | 11/2005 | Stanisic et al. | 324/424 |
| 7,109,720 B2 * | 9/2006 | Baurand et al. | 324/421 |
| 7,123,461 B2 * | 10/2006 | Wimmer | 361/93.1 |
| 2005/0231877 A1 * | 10/2005 | Komatsu et al. | 361/103 |
| 2007/0001677 A1 * | 1/2007 | Adam et al. | 324/421 |

FOREIGN PATENT DOCUMENTS

| | | |
|---|---|---|
| DE | 36 14 206 A1 | 9/1987 |
| DE | 198 53 511 A1 | 6/2000 |
| EP | 1 555 683 A | 7/2005 |
| JP | 58-070170 A | 7/1983 |

OTHER PUBLICATIONS

Groth R. et al; "Diagnose an Hochspannungs-Leistungsschaltern" Elektrotechnische Zeitschrift—ETZ, VDE Verlag GmbH, Berlin, DE, bd 114, nr. 19, Oct. 1, 1993, Seiten 1214-1216, 1218, XP000403004.

(Continued)

*Primary Examiner*—Vincent Q. Nguyen
*Assistant Examiner*—Hoai-An D Nguyen
(74) *Attorney, Agent, or Firm*—Buchanan Ingersoll & Rooney PC

(57) ABSTRACT

A method and an apparatus are disclosed for measuring contact erosion in an electrical switching device by a dynamic resistance measurement (DRM). To determine an overlap time and a contact erosion in an exemplary switching device, a change in current across the switching device can be measured indirectly by a measurement current being passed across the switching device and a parallel conductor, the change in current in the parallel conductor being measured. Exemplary embodiments relate, to the following: detection of a differential current measurement signal in the parallel conductor with the aid of a Rogowski coil; and selection of a parallel conductor resistance on an order of the switch resistance.

20 Claims, 3 Drawing Sheets

OTHER PUBLICATIONS

Stokes A D et al. Electrochemical Society: "Circuit-Breaker Diagnostics" ULSI Science and Technology 1987 Philadephia, May 11-15, 1987 Proceedings of the International Symposium on Ultra Large Scale Integration Science and Technology, Pennington, Electrochemical Society, US, Bd. Symp. 1, Aug. 28, 1988, Seiten 1-8, XP000042544.

Torres H et al: "Design, Construction and Calibration of Three Devices to Measure Directly Lightning Parameters" High Voltage Engineering, 1999. Eleventh International Symposium on (Conf. Publ. No. 467) London, UK Aug. 23-27, 1999 London, UK,IEE, UK, Aug. 23, 1999, Seiten 1-4, XP001152461.

* cited by examiner

MONITORING SYSTEM FOR HIGH-VOLTAGE SWITCHES

CROSS REFERENCE TO RELATED APPLICATIONS

This application claims priority under 35 U.S.C. §119 to EP Application 05405679.1 filed in Europe on 30 Nov. 2005, the entire contents of which is hereby incorporated by reference in its entirety.

TECHNICAL FIELD

Features are disclosed regarding engineering, such as those relating to circuit breakers in electrical energy distribution systems. For example, a method and an apparatus are disclosed for monitoring a switching device.

BACKGROUND INFORMATION

Dynamic resistance measurement (DRM) is used for determining the overlap time of a circuit breaker. The overlap time is the time difference between the separation of the contacts in the rated current contact system and the separation of the contacts in the consumable or arcing contact system and indicates how severely the arcing contacts have already been eroded. It is therefore possible to assess the remaining life time of a quenching chamber. In the case of DRM, during CO operation (close, then open switch) a constant direct current of the order of magnitude of 1 kA is transmitted via the switch and the voltage drop across the switch is recorded. Recording of the voltage makes it possible to determine the line resistance of the switch at any point in time. Thus, the two times at which the contact systems open, and therefore also the overlap time, can be determined. The fact that the transmitted direct current needs to be so great is because the resistances of the two contact systems are very low in value and differ from one another only slightly. Only when a very high current is transmitted the voltage difference between the consumable contact system and the rated current contact system is within the measurable range.

One aspect of this method is the size of the required apparatus which in each case needs to be transported to the corresponding installation. In addition to the transportation costs for the service personnel, transportation costs also arise for the test apparatus. In order to make savings on these costs, there is interest in a smaller measuring device which measures the overlap time with, for example, the same degree of reliability as the previous one, but can be transported as hand luggage by service personnel.

DESCRIPTION

A method and an apparatus are disclosed for monitoring contact erosion in an electrical switching device.

An exemplary method is disclosed for measuring contact erosion in an electrical switching device, which has a rated current path having a rated current contact system, and a consumable contact current path having a consumable contact system, an overlap time between the separation of the rated current contacts and of the consumable contacts being measured from a change in resistance when the rated current contacts and the consumable contacts are separated, and erosion of the consumable contacts being determined from this, in addition a first current and a second current being branched off from a feed current from a measurement current source, the first current being passed through the switching device, and the second current being passed in parallel with the switching device, and the second current being detected with the aid of a measurement system, and the overlap time being determined from a change in the second current as a function of time.

In a further aspect, an exemplary measurement system is disclosed for measuring contact erosion in an electrical switching device, which has a rated current path having a rated current contact system, and a consumable contact current path having a consumable contact system, the measurement system comprising a measurement current source, a sensor and an evaluation unit, which serve for measuring the resistance across the switching device in a time-dependent manner, i.e. for measuring the resistance across the switching device as a function of time, for determining an overlap time between the separation of the rated current contacts and of the consumable contacts, and for determining erosion of the consumable contacts from this, in addition a parallel conductor being provided in parallel with the switching device, and the sensor being arranged on the parallel conductor, the measurement current source being connected to the switching device for feeding a first current and to the parallel conductor for feeding a second current, and the sensor serving for detecting the second current, and the evaluation unit having means for determining the overlap time from a change in the second current as a function of time. Current detection in the parallel conductor can take place in a variety of ways, for example, by means of an inductively coupled sensor or a sensor coupled in another way. By using a parallel measurement current path, it is possible to indirectly measure the change in resistance across the switch with a high degree of precision even with a low feed measurement current.

In one exemplary embodiment, the current sensor is a Rogowski coil, which measures a differential current measurement signal which is proportional to the first time derivative of the second current. Owing to its differential response, the Rogowski coil has a high degree of measurement sensitivity for changes in the second current and indirectly the first current. In particular, the differential current measurement signal can be evaluated for determining the overlap time without any prior integration and/or after integration over time.

Further embodiments, advantages and applications can be derived from the description now following and the figures.

BRIEF DESCRIPTION OF THE DRAWINGS

In the drawings, schematically.

The same reference symbols are used for identical parts in the figures.

DETAILED DESCRIPTION

Figure 1:
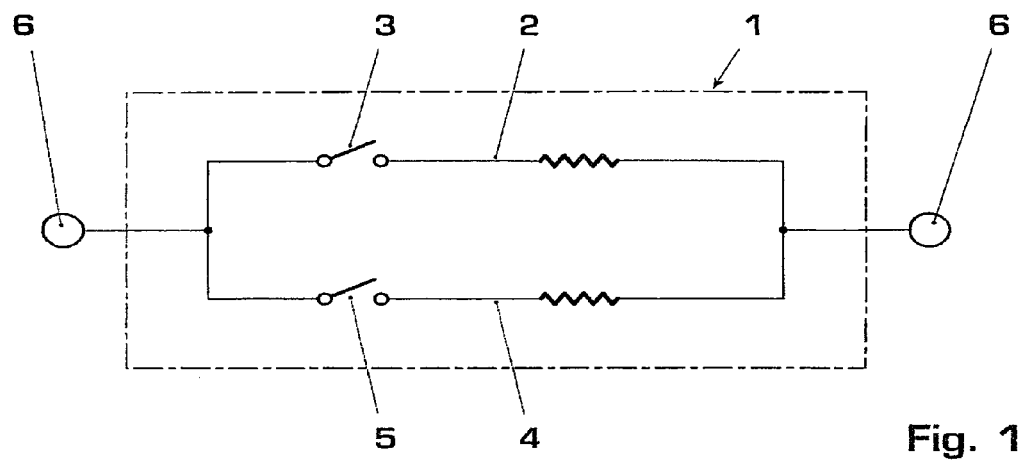
FIG. 1 shows a simplified electrical circuit diagram of an exemplary switching device having two contact systems.

Circuit breakers 1, for example high-voltage circuit breakers, high current breakers (generator circuit breakers) or switch disconnectors, have in principle two contact systems, namely a rated current contact system 3 and an arcing or consumable contact system 5. The rated current contact system 3 has the task of transmitting the current in as loss-free a manner as possible when the switch 1 is closed. It is therefore distinguished by a very low line and contact resistance. The consumable contact system 5 only carries a notable current during the short time between opening of the rated current contacts 3 and it opening itself. The resistance of the consumable contact system 5 can therefore have a less significant role, and for this reason this resistance can be considerably greater than the resistance of the rated current contact system 3 in all circuit breakers 1.

FIG. 1 shows a schematic illustration of such a circuit breaker 1. In a tripping operation (open), the rated current contact system 3 is opened first. The current commutates from the rated current path 2 to the consumable contact current path 4 having the consumable contact system 5, which likewise opens after a few milliseconds of overlap time or commutation time.

In the case of dynamic resistance measurement (DRM), use is made, for the purpose of determining the overlap time, of the fact that the resistances of the two contact systems differ. In a generator circuit breaker, the resistances may be, for example, $2\mu\Omega$-$20\mu\Omega$ for the nominal or rated current contacts 3 and $300\mu\Omega$-$800\mu\Omega$ for the arcing or consumable contacts 5. Known DRM's can have an extraordinarily high constant direct current of the order of 1 kA transmitted across the closed switch 1 in order to be able to measure the voltage difference between the consumable and rated current contact system with a sufficient degree of accuracy.

Figure 2:
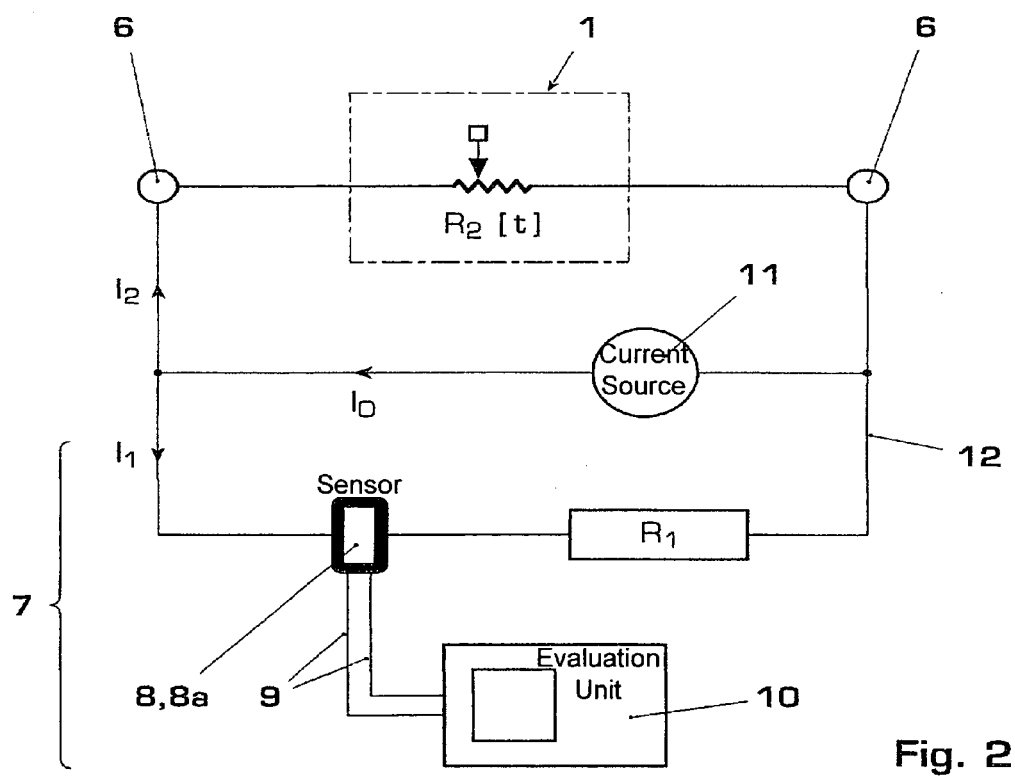
FIG. 2 shows an exemplary embodiment of a measurement system having a parallel conductor for monitoring contact erosion in a switching device.

FIG. 2 shows an exemplary embodiment of dynamic resistance measurement, referred to as DRM light. DRM light differs in principle from a known DRM method. The change in resistance in the switch 1 is measured with the aid of a conductor 12, which is fitted in parallel and carries more or less current depending on the state of the switch 1. In this case, a switch resistance $R_2(t)$ to be measured dynamically, i.e. in a time-dependent manner, is present across the switching device 1, and a parallel conductor resistance $R_1$ is present across the parallel conductor 12 which is connected in parallel to the switching device 1. Advantageously the connecting resistance at contact terminals is included in the parallel resistance $R_1$.

In detail, FIG. 2 shows the switching device 1 having terminals or measurement terminals 6, to which the measurement system 7 is electrically connected. The measurement system 7 comprises a measurement current source 11, a sensor 8, 8a and an evaluation unit 10, which serve for measuring the resistance across the switching device 1 in a time-dependent manner, for determining an overlap time between the separation of the rated current contacts 3 and of the consumable contacts 5, and for determining erosion of the consumable contacts 5 from this. The sensor 8, 8a can be arranged on the parallel conductor 12, the measurement current source 11 can be connected to the switching device 1 for feeding a first current $I_2$ and to the parallel conductor 12 for feeding a second current $I_1$, and the sensor 8, 8a can detect the second current $I_1$, the evaluation unit 10 having means for determining the overlap time $\Delta T$ from a change in the second current $I_1$ as a function of time t. Exemplary embodiments are given below.

Advantageously and as illustrated in FIG. 2, the total feed current $I_0$ can be equal to the sum of the first and second current $I_1+I_2$; and/or the measurement current source 11 can be a constant direct current source 11, for example an accumulator or rechargeable battery having a series resistor, for example, with high resistance. The rechargeable battery produces a constant direct current $I_0$ of the order of a few amperes. Together with the parallel conductor 12 as a current measurement branch, this is sufficient for measuring overlap time and contact erosion of the switch 1 in a very precise manner.

The measurement system 7 can also comprise means for detecting contact movement s(t). The measurement system 7 can also be designed as a portable device. The switching device 1 to be investigated may, for example, be a circuit breaker 1, a high current breaker or generator circuit breaker 1, or a switch disconnector 1.

Figure 3:
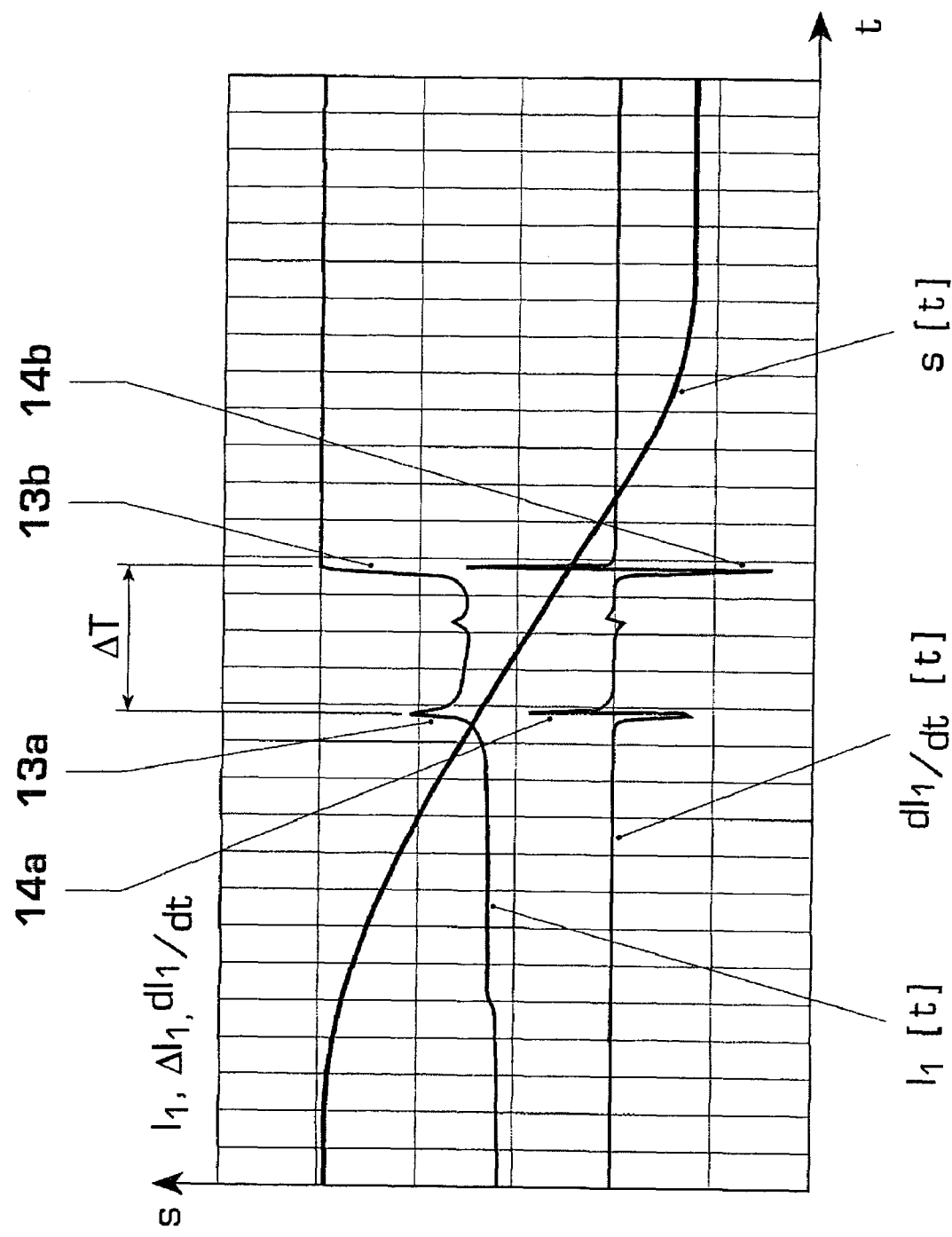
FIG. 3 shows a graph with current or voltage measurement curves and a displacement/time curve for dynamic resistance measurement.

As shown in FIG. 2 and FIG. 3, the sensor 8, 8a serves for detecting a current measurement signal, for example $I_1(t)$ or $\Delta I_1(t)$ or $dI_1(t)/dt$ or another time derivative of the second current $I_1$ or combinations of such current variables, as a function of time t, the current measurement signal characterizing the second current $I_1$ through the parallel conductor 12 and, as a result, indirectly the first current $I_2$ across the switch 1. The sensor 8, 8a can be a current sensor, which measures, for example inductively, a differential current measurement signal $\Delta I_1(t)$ or $dI_1(t)/dt$ proportionally to a time derivative of the second current $I_1$. The current sensor 8a can be a Rogowski coil 8a, which measures a differential current measurement signal $\Delta I_1(t)$ or $dI_1(t)/dt$ proportionally to the first time derivative of the second current $I_1$.

For the Rogowski coil 8a or generally a magnetic current measurement device, the output signal can be described by $u(t)=M*dI_1(t)/dt$, wherein $u(t)$ is a voltage induced in the measurement coil, which voltage is available as an output signal, and the proportionality factor M denotes a mutual inductance, which exists between the measuring coil and the current path.

Furthermore, the evaluation unit 10 can have means for detecting a first and second signature 13a, 13b; 14a, 14b in the current measurement signal, for example $I_1(t)$ or $\Delta I_1(t)$ or $dI_1(t)/dt$, the signatures 13a, 13b; 14a, 14b being caused by the changes in resistance when the rated current contacts 3 and the consumable contacts 5 are separated. Furthermore, the evaluation unit 10 can have means for determining the overlap time $\Delta T$ from the difference between the points in time of the first and second signature 13a, 13b; 14a, 14b.

This will be explained in more detail with reference to FIG. 3. FIG. 3 shows, over a common time axis t, a displacement curve s(t) of the contact movement in the switch 1, which can be recorded in various manners known per se (for example by means of a linear potentiometer on the drive), and a direct current measurement signal $I_1(t)$ and a differential current measurement signal $\Delta I_1(t)$ or $dI_1(t)/dt$, which is proportional to a first derivative of the direct current measurement signal $I_1(t)$. Such a differential current measurement signal can be obtained by inductive coupling to the second current $I_1$.

When the switch 1 is completely closed, the feed current $I_0$ is split between the rated current contact system 3, the consumable contact system 5 and the parallel conductor 12. When the rated current contact system 3 opens, the resistance $R_2(t)$ in the switch 1 is increased, as a result of which the current $I_1$ in the parallel conductor 12 is also increased. Once the switch 1 has completely opened, the total current $I_0=I_1$ flows through the parallel conductor 12. The changes in current $\Delta I_1(t)$ or the time derivative $dI_1(t)/dt$ in the parallel conductor 12 are or is detected by means of a Rogowski coil 8a. It is possible for the direct current measurement signal $I_1(t)$ to be determined from the Rogowski coil signal $\Delta I_1(t)$ or $dI_1(t)/dt$ by means of integration over time, for example by measurement technique or by calculation.

It can be seen that the overlap time or commutation time $\Delta T$ which is sought can be determined by measuring the time between the peaks generated by the Rogowski coil 8a. Integration of the coil signal is not necessary, but may prevent erroneous interpretations. The reliability of the dynamic resistance measurement method and the resistance measurement apparatus 7 can be modified by evaluating the points in time from the direct current measurement signal $I_1(t)$ or the or a differential current measurement signal $\Delta I_1(t)$ or $dI_1(t)/dt$ or possibly a higher-order time derivative.

The measurement curves $s(t)$, $\Delta I_1(t)$ or $dI_1(t)/dt$ and $I_1(t)$ in FIG. 3 have been taken experimentally on generator circuit breakers 1 and allow for reliable determination of the overlap time $\Delta T$, the contact erosion and the required maintenance work and inspection times for the switch 1.

Thus, in the current measurement signals $I_1(t)$ or $\Delta I_1(t)$ or $dI_1(t)/dt$ there occurs a first signature 13a, 14a, which characterizes a first point in time for rated current contact separation, and a second signature 13b, 14b, which characterizes a second point in time for consumable contact separation. In the given example, the signatures 13a, 13b are peaks in the direct current measurement signal $I_1(t)$, and the signatures 14a, 14b are the first time derivative of the peaks in the differential current measurement signal $\Delta I_1(t)$ or $dI_1(t)/dt$. Depending on the sensor 8, 8a and measuring device 10, other signatures are also possible and can be evaluated with respect to their occurrence in time.

In the exemplary embodiment shown in FIG. 3, the change in resistance $\Delta R_2$ in the switch 1 is very low in the first transition 13a, 14b from the rated current contact system 3 to the consumable contact system 5. $\Delta R_2$ can, for example, be in the $\mu\Omega$ range. In order to be able to reliably determine this first transition 13a, 14a, given a change in resistance $\Delta R_2$, a change in current $\Delta I_1$ can be achieved which is as great as possible. At the same time, the current $I_0$ to be fed can be kept low. Exemplary values for $\Delta I_1$ of the range of a few hundred mA and for $I_0$ of a few A are reached. For this purpose, the resistance $R_1$ of the parallel conductor 12 can also be optimized, and there remains the question of to what extent the results depend on the resistance $R_1$ of the parallel conductor 12.

In accordance with one exemplary embodiment, the parallel conductor resistance $R_1$ can be selected optimally. The following applies $$I_1(t) = I_0 \frac{R_2(t)}{R_1 + R_2(t)}, \quad [1]$$

where $I_0$ is the current of the current source, $R_1$ is the resistance of the parallel conductor and $R_2(t)$ is the resistance of the switch which is variable over time. When the resistance $R_2(t)$ changes by $\Delta R_2$, the current $I_1(t)$ at time $t_1$ changes by $\Delta I_1$, which is approximately given by $$\Delta I_1 = \frac{\partial I_1}{\partial R_2}\bigg|_{R_2=R_2(t_1)} \Delta R_2, \quad [2]$$

and the following applies $$\Delta I_1 = I_0 * \Delta R_2 * k(R_1) \quad [3]$$

$$k(R_1) = R_1 * (R_1 + R_2)^{-2} \quad [4],$$

wherein $R_2$ at time $t_1$ is the value of the resistance of the consumable contact system 5 of the switch 1 and $k(R_1)$ is a proportionality constant or a sensitivity coefficient as a function of the parallel conductor resistance $R_1$.

Figure 4:
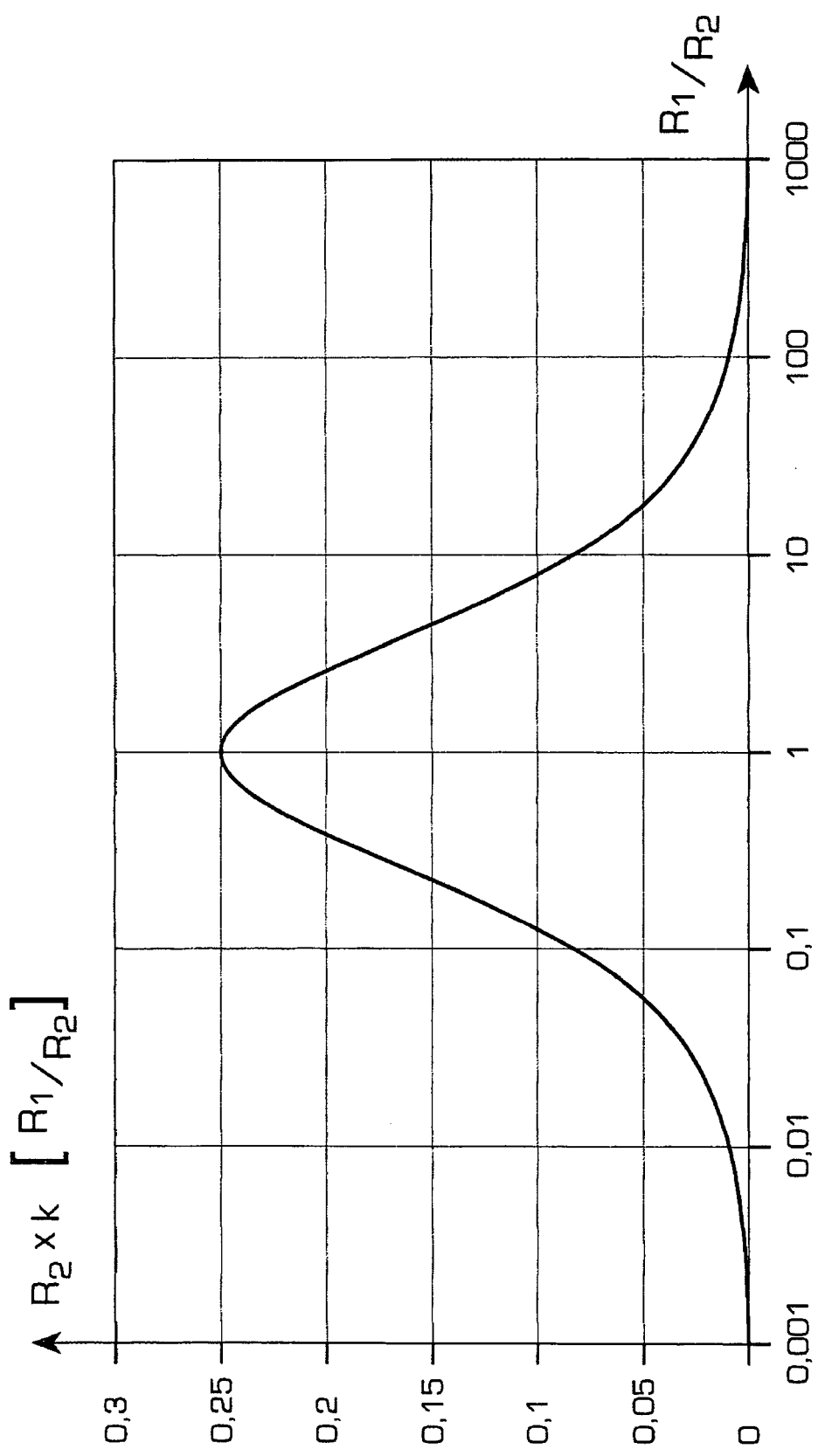
FIG. 4 shows a graph for optimizing the parallel conductor resistance.

FIG. 4 shows the sensitivity function $R_2*k$ as a function of $R_1/R_2$. It has a maximum $k_{max}=0.25$ [$1/\Omega$] for $R_2=R_1$ and decreases for $R_2>R_1$ (likewise for $R_2<R_1$). In accordance with an exemplary embodiment, a ratio of the parallel conductor resistance $R_1$ and the switch resistance $R_2$ can be chosen to be less than 100, preferably less than 30, particularly preferably less than 10, in particular less than 5. In absolute values, the parallel conductor resistance $R_1$ can be chosen to be less than 10 m$\Omega$, preferably less than 2 m$\Omega$, particularly preferably less than 1 m$\Omega$, in particular equal to a maximum of the switch resistance $R_2$.

Measurement methods can, of course, be performed for carrying out measurements described herein.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Electrical switching device, interrupter unit, high-voltage circuit breaker, high current circuit breaker
2 Rated current path
3 Rated current contact system
4 Consumable contact current path
5 Consumable contact system
6 Terminals for measurement system
7 Measurement system
8 Detection unit, sensor, current sensor
8a Rogowski coil
9 Signal lines
10 Evaluation unit, measurement electronics
11 Measurement current source, direct current source
12 Parallel conductor, parallel current path
13a, 13b First signature, first peak in current measurement signal
14a, 14b Second signature, second peak in current measurement signal
$I_0$ Feed current
$I_1$ Second current, measurement current through parallel conductor
$I_2$ First current, current through switching device, switch current
$I_1(t)$, $I_2(t)$ Current variable over time
$dI_1(t)/dt$ Time derivative of the second current
$\Delta I_1$, $\Delta I_2$ Changes in current
$I_1(t)$, $\Delta I_1(t)$, $dI(t)/dt$ Current measurement signal through parallel conductor
$k$ Constant, sensitivity function
$R_1$ Resistance of the parallel conductor, parallel conductor resistance
$R_2(t)$ Resistance of the switching device, resistance of the consumable contact system, switch resistance
$\Delta R_2$ Change in resistance of the switching device, change in resistance of the consumable contact system
$t$ Time coordinate
$\Delta T$ Overlap time
$s(t)$ Displacement/time curve of the drive or of the contacts

The invention claimed is:

1. A method for measuring contact erosion in an electrical switching device, which has a rated current path having a rated current contact system, and a consumable contact current path having a consumable contact system, an overlap time between the separation of the rated current contacts and of the consumable contacts being measured from a change in resistance when the rated current contacts and the consumable contacts are separated, and erosion of the consumable contacts being determined from this, comprising:
 a) branching a first current and a second current from a feed current of a measurement current source;
 b) passing the first current through the switching device, and passing the second current in parallel with the switching device; and
 c) detecting the second current with the aid of a measurement system, and determining the overlap time from a change in the second current as a function of time.

2. The method for measuring contact erosion as claimed in claim 1, wherein a current measurement signal, which characterizes the second current, is detected as a function of time with the aid of a current sensor.

3. The method for measuring contact erosion as claimed in claim 1, comprising:
 a) owing to changes in resistance when the rated current contacts are separated, measuring a first signature in the current measurement signal; and
 owing to changes in resistance when the consumable contacts are separated, measuring a second signature in said current measurement signal; and
 b) determining the overlap time from a difference between points in time of the first and second signature.

4. The method for measuring contact erosion as claimed in claim 1, comprising:
 a) measuring a differential current measurement signal proportional to a time derivative of the second current by the measurement system.

5. The method for measuring contact erosion as claimed in claim 1, comprising:
 a) measuring a differential current measurement signal proportional to the first time derivative of the second current by a Rogowski coil.

6. The method for measuring contact erosion as claimed in claim 4, wherein
 a) the differential current measurement signal is evaluated without any prior integration for determining the overlap time; and/or
 b) the differential current measurement signal is integrated and then evaluated for determining the overlap time.

7. The method for measuring contact erosion as claimed in claim 1, wherein:
 a) the total feed current is split into the first current and the second current; and/or
 b) a constant direct current on an order of magnitude of a few amperes is fed in by the measurement current source.

8. The method for measuring contact erosion as claimed in claim 1, wherein during a measurement phase prior to separation of the consumable contacts:
 a) the first current is subjected to a switch resistance via the switching device, and the second current is subjected to a parallel conductor resistance through a parallel conductor connected in parallel to the switching device; and
 b) a ratio between the parallel conductor resistance and the switch resistance is selected to be less than 100; and
 c) the parallel conductor resistance is selected to be less than 10 mΩ.

9. The method of claim 8, wherein the ratio between the parallel conductor resistance and the switch resistance is less than 5.

10. The method of claim 8, wherein the parallel conductor resistance is selected to be equal to a maximum of the switch resistance.

11. A measurement system for measuring contact erosion in an electrical switching device, which has a rated current path having a rated current contact system, and a consumable contact current path having a consumable contact system, the measurement system, comprising:
 a measurement current source, a sensor, and an evaluation unit, which serve for measuring resistance across the switching device as a function of time, for determining an overlap time between a separation of rated current contacts and consumable contacts, and for determining erosion of the consumable contacts; and
 a parallel conductor provided in parallel with the switching device, the sensor being arranged on the parallel conductor, wherein
  the measurement current source is connected to the switching device for feeding a first current, and to the parallel conductor for feeding a second current; and
  the sensor detects the second current, the evaluation unit having means for determining the overlap time from a change in the second current as a function of time.

12. The measurement system as claimed in claim 11, wherein:
 a) the sensor detects a current measurement signal, which characterizes the second current, as a function of time and is a current sensor; and
 b) the current sensor measures a differential current measurement signal which is proportional to a time derivative of the second current.

13. The measurement system as claimed in claim 12, wherein:
 a) the current sensor is a Rogowski coil and measures a differential current measurement signal which is proportional to the first time derivative of the second current; and
 b) to determine the overlap time, the differential current measurement signal is evaluated without any prior integration and/or after integration over time.

14. The measurement system as claimed in claim 12, wherein:
 a) the evaluation unit has means for detecting a first and second signature in the current measurement signal, which signatures occur owing to changes in resistance when the rated current contacts and the consumable contacts are separated; and
 b) the evaluation unit has means for determining the overlap time from a difference between points in time of the first and second signature.

15. The measurement system as claimed in claim 11, wherein:
 a) the total feed current is equal to a sum of the first and second current; and/or
 b) the measurement current source provides a constant direct current on an order of a few amperes and is an accumulator having a series resistor.

16. The measurement system as claimed in claim 11, wherein during a measurement phase prior to separation of the consumable contacts:
 a) a switch resistance is present across the switching device, and a parallel conductor resistance is present across the parallel conductor being connected in parallel to the switching device; and b) a ratio between the parallel conductor resistance and the switch resistance is less than 100; and c) the parallel conductor resistance is less than 10 mΩ.

17. The measurement system as claimed in claim 16, wherein the ratio between the parallel conductor resistance and the switch resistance is less than 5.

18. The measurement system as claimed in claim 16, wherein the parallel conductor resistance is equal to a maximum of the switch resistance.

19. The measurement system as claimed in claim 16, wherein the parallel conductor resistance is less than 1 mΩ.

20. The measurement system as claimed in claim 11, wherein:

a) the measurement system comprises means for detecting the contact movement; and/or b) the measurement system is a portable device; and/or c) the switching device is a circuit breaker, a high current breaker, or a switch disconnector.

* * * * *